(12) United States Patent
Morthier

(10) Patent No.: US 7,653,093 B2
(45) Date of Patent: Jan. 26, 2010

(54) WIDELY TUNABLE TWIN GUIDE LASER STRUCTURE

(75) Inventor: Geert Morthier, Ghent (BE)

(73) Assignees: IMEC, Leuven (BE); Universiteit Gent, A Belgium University, Gent (BE)

(*) Notice: Subject to any disclaimer, the term of this patent is extended or adjusted under 35 U.S.C. 154(b) by 581 days.

(21) Appl. No.: 10/237,500

(22) Filed: Sep. 9, 2002

(65) Prior Publication Data

US 2003/0128724 A1    Jul. 10, 2003

Related U.S. Application Data

(60) Provisional application No. 60/318,513, filed on Sep. 10, 2001.

(51) Int. Cl.
*H01S 3/10* (2006.01)
*H01S 3/08* (2006.01)

(52) U.S. Cl. .................... 372/20; 372/43.01; 372/96; 372/102

(58) Field of Classification Search .............. 372/20, 372/29, 49, 50, 43.01, 92, 96, 102
See application file for complete search history.

(56) References Cited

U.S. PATENT DOCUMENTS

| | | | | | |
|---|---|---|---|---|---|
| 4,885,753 | A | * | 12/1989 | Okai et al. | 372/45.01 |
| 5,090,790 | A | * | 2/1992 | Zucker | 385/130 |
| 5,416,866 | A | * | 5/1995 | Sahlen | 385/37 |
| 5,502,741 | A | * | 3/1996 | Carroll et al. | 372/96 |
| 5,586,131 | A | * | 12/1996 | Ono et al. | 372/19 |
| 5,621,828 | A | * | 4/1997 | Baets et al. | 385/14 |
| 5,648,978 | A | * | 7/1997 | Sakata | 372/50.11 |
| 5,699,378 | A | * | 12/1997 | Lealman et al. | 372/102 |
| 5,748,660 | A | * | 5/1998 | Delorme et al. | 372/50 |
| 5,841,799 | A | * | 11/1998 | Hiroki | 372/19 |
| RE36,710 | E | * | 5/2000 | Baets et al. | 385/14 |
| 6,091,745 | A | * | 7/2000 | Nitta | 372/27 |
| 6,198,863 | B1 | * | 3/2001 | Lealman et al. | 385/37 |
| 6,208,793 | B1 | * | 3/2001 | Hillmer et al. | 385/131 |
| 6,349,106 | B1 | * | 2/2002 | Coldren | 372/50 |
| 6,411,640 | B1 | * | 6/2002 | Nakanishi | 372/96 |
| 6,574,259 | B1 | * | 6/2003 | Fish et al. | 372/50 |
| 6,580,739 | B1 | * | 6/2003 | Coldren | 372/50 |
| 6,614,819 | B1 | * | 9/2003 | Fish et al. | 372/26 |

(Continued)

OTHER PUBLICATIONS

Vankwikelberge et al., "CLADISS—A Longitudinal Multimode Model for the Analysis of the Static, Dynamic, and Stochastic Behavior of Diode Lasers with Distributed Feedback," *IEEE Journal of Quantum Electronics* 26(10):1728-1741 (1990).

(Continued)

*Primary Examiner*—Minsun Harvey
*Assistant Examiner*—Phillip Nguyen
(74) *Attorney, Agent, or Firm*—McDonnell Boehnen Hulbert & Berghoff LLP

(57) ABSTRACT

A widely tunable laser structure with at least two different sampled or superstructure gratings is provided. The widely tunable laser only requires as much tuning currents as gratings. In the case of two gratings, two tuning currents, instead of 3 tuning currents in a typical laser, are needed. Alternatively, the laser structure can be denoted a sampled or superstructure grating tunable laser with wide tunability characteristics, with a limited amount of needed tuning parameters, e.g., two currents.

14 Claims, 4 Drawing Sheets

U.S. PATENT DOCUMENTS 6,624,000 B1 * 9/2003 Coldren .................... 438/29
6,728,279 B1 * 4/2004 Sarlet et al. ............. 372/43.01
2004/0105476 A1 * 6/2004 Wasserbauer ............. 372/50

OTHER PUBLICATIONS

Amann et al., "Tunable twin-guide laser: A novel laser diode with improved tuning," *Appl. Phys. Lett.* 54(25): 2532-2533 (1989).

Amann et al., "Tunable laser diodes," Artech House, Norwood, MA, 1998, pp. 167-177.

Amann et al., "Tunable Laser Diodes Utilizing Transverse Tuning Scheme," *J. Lightwave Technol.*, vol. 11, No. 7, pp. 1168-1182, 1993.

Ishii et al., "Quasicontinuous Wavelength Tuning in Super-Structure-Grating (SSG) DBR Lasers," *IEEE J. Quantum Electron.*, vol. 32, No. 3, pp. 433-440, 1996.

Jayaraman et al., "Theory, Design, and Performance of Extended Tuning Range Semiconductor Lasers with Sampled Gratings," *IEEE J. Quantum Electron.*, vol. 29, No. 6, pp. 1824-1834, 1993.

Kuzentsov et al., "Design of Widely Tunable Semiconductor Three-Branch Lasers," *J. Lightwave Technol.*, vol. 12, No. 12, pp. 2100-2106, 1994.

Öberg et al., "74 nm Wavelength Tuning Range of an InGaAsP/InP Vertical Grating Assisted Codirectional Coupler Laser with Rear Sampled Grating Reflector," *IEEE Photon. Technol. Lett.*, vol. 5, No. 7, pp. 635-638, 1993.

* cited by examiner

WIDELY TUNABLE TWIN GUIDE LASER STRUCTURE

REFERENCE TO RELATED APPLICATIONS

This application claims priority benefits to U.S. Provisional Application Ser. No. 60/318,513 filed on Sep. 10, 2001. This application further incorporates by reference U.S. Provisional Patent Application Ser. No. 60/318,513 filed on Sep. 10, 2001 in its entirety. This application is also related to U.S. patent application Ser. No. 09/573,794 filed on May 16, 2000. This application incorporates U.S. patent application Ser. No. 09/573,794 filed on May 16, 2000 in its entirety.

FIELD OF THE INVENTION

The present invention relates to methods and structures for integrated semiconducting lasers.

BACKGROUND OF THE INVENTION

Monolithically integrated tunable laser diodes, and in particular widely tunable laser diodes, are considered key devices for future High-Density Wavelength Division Multiplexing (HD-WDM) communication systems. When used as a spare transmitter, they can replace a large number of fixed wavelength Distributed Feedback (DFB) laser diodes and thus reduce inventory costs significantly. In addition, they can be used to introduce additional functionality into optical networks and thus can improve network flexibility or reduce the complexity of other network elements such as cross connects. Dynamic switching of the transmitter wavelength allows to some extent the introduction of packet switching. The tunable laser is also an essential part of another future key component of optical networks, the wavelength converter with tunable pump wavelength.

All widely tunable laser diodes based on electric tuning (i.e., with a tuning range of at least a few tens of nanometers) presented so far rely on at least 3 tuning currents, e.g., a current for each of the 2 grating sections and a phase current in the case of Distributed Bragg Reflector (DBR)-type devices. M.-C. Amann, J. Buus, "Tunable laser diodes", Artech House, Norwood, Mass., 1998. The presence of at least 3 tuning sections has a number of serious drawbacks. First, the entire characterization of the laser and the selection of stable operation points require an extensive, time-consuming and costly characterization (in a 3-dimensional space if the active section current is not considered). Second, the long cavities that result from the presence of at least 3 (often passive) tuning sections in series prohibit direct modulation at high modulation frequencies and often limit the maximum output power.

Tunable twin guide (TTG) laser diode [M.-C. Amann, S. Illek, C. Schanen, et al., "Tunable Twin-Guide Laser—A novel laser diode with improved tuning performance", Appl. Phys. Lett., Vol. 54, pp. 2532-2535, 1989.], presented as an alternative for the long 3-section DBR laser diodes, has a single tuning possibility; hence, tuning is based on a single tuning current, and the tuning of said TTG laser diode is limited.

Over the past years, several advanced laser structures have been proposed with an extended tuning range. Examples are the Y-laser [M. Kuznetsov, P. Verlangieri, A. G. Dentai, C. H. Joyner, and C. A. Burrus, "Design of widely tunable semiconductor three-branch lasers," J. Lightwave Technol., vol. 12, no. 12, pp. 2100-2106, 1994], the co-directionally coupled twin-guide laser [M.-C. Amann, and S. Illek, "Tunable laser diodes utilizing transverse tuning scheme," J. Lightwave Technol., vol. 11, no. 7, pp. 1168-1182, 1993], the Sampled Grating (SG) DBR laser [V. Jayaraman, Z. M. Chuang, and L. A. Coldren, "Theory, design and performance of extended tuning range semiconductor lasers with sampled gratings," IEEE J. Quantum Electron., vol. 29, no. 6, pp. 1824-1834, 1993], the Super Structure Grating (SSG) DBR laser [H. Ishii, H. Tanobe, F. Kano, Y. Tohmori, Y. Kondo, and Y. Yoshikuni, "Quasicontinuous wavelength tuning in superstructure-grating (SSG) DBR lasers," IEEE J. Quantum Electron., vol. 32, no. 3, pp. 433-440, 1996] and the Grating assisted Coupler with rear Sampled Reflector (GCSR) laser [M. Öberg, S. Nilsson, K. Streubel, L. Bäackbom, and T. Klinga, "74 nm wavelength tuning range of an InGaAsP/InP vertical grating assisted codirectional coupler laser with rear sampled grating reflector," IEEE Photon. Technol. Lett., vol. 5, no. 7, pp. 735-738, 1993]. In the first two types of devices, a trade-off had to be made between the tuning range and the spectral purity (broad tuning range vs. high Side Mode Suppression Ratio (SMSR)). Therefore, recently most research attention has directed at the (S)SG-DBR and GCSR lasers.

AIM OF THE INVENTION

It is an aim of the invention to present a short laser structure with wide tunability and which is easily controllable, e.g., with a minimum number of tuning currents.

SUMMARY OF THE INVENTION

A widely tunable laser structure with at least two different sampled or superstructure gratings is provided. The widely tunable laser only requires as much tuning currents as gratings. In the case of two gratings, two tuning currents, instead of 3 tuning currents in a typical laser, are needed. Alternatively, the laser structure can be denoted a sampled or superstructure grating tunable laser with wide tunability characteristics, with a limited amount of needed tuning parameters, e.g., two currents.

It is an aspect of the invention to recognize that the presence of a phase section with current injection, assumed to be needed in order to obtain monomodal behavior in lasers with low feedback or reflection, typical when multiple gratings like sampled or super structure gratings are used, is not needed when a twin guide laser type approach is used.

The invention concerns a widely tunable laser structure, more in particular a tunable twin guide laser with at least two different sampled or superstructure gratings, located in the direction perpendicular to the lasing direction. The widely tunable laser only requires as much tuning currents as gratings. In case of two gratings, two tuning currents, instead of 3 tuning currents in a typical laser, are needed. Alternatively, the laser structure can be denoted a sampled or superstructure grating tunable twin-guide laser with wide tunability characteristics only requiring limited amount of tuning parameters, e.g., two currents. The laser has a much shorter cavity length than existing widely tunable laser diodes because no phase section with current injection is required (no functioning phase section is necessary) and/or due to the relative position of the gratings and the active section with respect to each other (e.g., the gratings and active section may be perpendicular to one another).

In one embodiment, the laser is an integrated/semiconductor tunable optical laser, comprising a sequence of semiconducting layers grown one upon another in the direction perpendicular to the lasing direction and comprising an active section for generating emission and a tuning section, the active section and tuning section being located perpendicular to the lasing direction with respect to each other, wherein the tuning section comprises at least two subsection, being located in the lasing direction with respect to each other.

Optionally, the tuning subsection of the laser includes a waveguide system that includes reflectors having spaced reflective maxima points providing a maximum reflection of an associated wavelength, wherein the spacing of at least two of the reflective maxima points of the respective sections are different, and only one the reflective maxima of the sections overlapping. Further, optionally, at least one of the waveguide systems in the laser has a periodically broken short-period structure including short period stripped regions alternating with non-stripped regions. Optionally, at least one of the waveguide systems in the laser has a diffractive grating having a plurality of repeating unit regions each having a constant length, thus forming a modulation period, and at least one parameter that determines the optical reflectivity or transmission of the diffractive grating varies depending on its position in each of the repeating unit regions along a direction of optical transmission in the laser, the diffractive grating extending by at least two modulation periods.

Typically, a laser diode is considered to be widely tunable if the tuning range is of at least a few tens of nm.

In one aspect, the integrated/semiconductor tunable optical laser may be a part of a High-Density Wavelength Division Multiplexing (HD-WDM) communication system. In another aspect, the integrated/semiconductor tunable optical laser may be a part of a transmitter.

In still a separate aspect, a method for changing the lasing frequency of an integrated/semiconductor tunable optical laser is provided. The laser may comprise an active section for generating emission and a tuning section, wherein the active section and the tuning section are located perpendicular to a lasing direction with respect to each other, wherein the tuning section comprises at least two subsections located in the lasing direction with respect to each other, wherein the tuning subsections include a waveguide system with reflectors having spaced reflective maxima points that provide maximum reflection of an associated wavelength, and wherein the spacing of at least two of the reflective maxima points of the respective sections are different, and only one the reflective maxima of the sections overlaps. The method changes the lasing frequency from a first frequency to a second frequency, the second frequency being spaced from the first frequency by a first distance, the apparatus comprising a substrate made of semiconducting material, a plurality of connected sections on the substrate, with at least two of the sections, being resonators, having spaced resonant maxima points providing a maximum resonance with an associated wavelength, wherein the spacing of at least two of the resonant maxima points of the respective sections being essentially not equal, the method comprising the step of changing the relative position of the resonant maxima points of the resonators with a second distance, being substantially smaller than the first distance.

DETAILED DESCRIPTION OF THE INVENTION

For the purpose of teaching of the invention, preferred embodiments of the method are described in the sequel. The present invention will be described with respect to certain embodiments and drawings. It will however be apparent to the person skilled in the art that other alternatives and equivalents or embodiments of the invention or combinations thereof can be conceived and reduced to practice without departing from the true spirit of the invention as defined in the attached claims.

Figure 1:
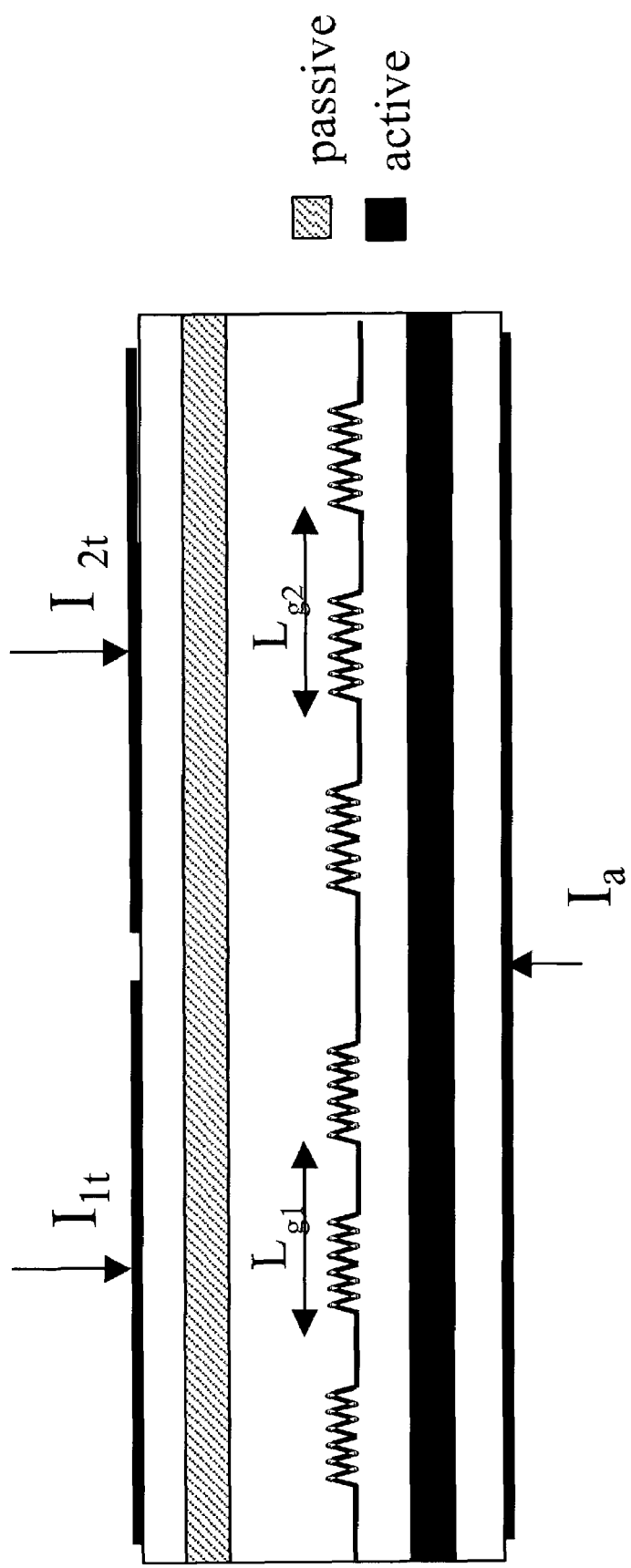
FIG. 1 shows an axial view of a sampled grating TTG laser diode.

An axial view of the structure proposed is shown in FIG. 1. FIG. 1 shows a TTG laser, except that the single grating of such a TTG laser is replaced by 2 sampled (or superstructure) gratings, being different with respect to each other. In general, more gratings can be used. The gratings can be different in length and/or different in sampling periods.

The gratings may be located above the active layer, meaning in the direction perpendicular to the lasing direction, and said gratings are located next to each other, but spaced apart, in the direction parallel to the lasing direction.

The effective refractive index in each grating section can be varied by current injection in the tuning waveguide. The different sampling periods in both gratings result in a number of reflection peaks which have a different wavelength separation for both gratings. By changing the tuning currents, however, one can make the peaks of each order overlap (as is done in an (S)SG-DBR laser).

In a preferred embodiment, between the gratings a phase shift $\pi$ is realized and anti-reflective coated facets are foreseen. Then, a laser is obtained which behaves as a quarter-wave-shifted DFB laser for each of the overlapping reflector pairs, such that lasing always occurs at the Bragg wavelength, but with a high tunability (e.g., a tuning range of at least a few tens of nm). By varying $I_{1t}$ and $I_{2t}$ such that the reflector pairs keep overlapping while the wavelengths of both reflector peaks vary simultaneously, one obtains continuous tuning. The side mode suppression is that of a quarter-wave-shifted DFB laser and hence very high. The single mode behavior is obtained by properly selecting the tuning currents. The presence of at least two gratings and hence two tuning currents offers larger controllability.

Simulations of the structure of FIG. 1 using an extension of the laser model CLADISS [P. Vankwikelberge, G. Morthier, R. Baets, "CLADISS—A longitudinal multimode model for the analysis of the static, dynamic and stochastic behavior of diode lasers with distributed feedback", IEEE Journ. Quant. El., Vol. 26, pp. 1728-1741, 1990.] are shown below. The two tuning sections had a length of 720 µm and superstructure periods of 72 and 80 µm, respectively; the gratings had a coupling coefficient of 50 cm$^{-1}$ and a duty cycle of 0.1. A carrier density dependence of the effective index of $6\times10^{-21}$ cm$^3$ and a carrier density dependence of the waveguide loss of $1.6\times10^{-17}$ cm$^2$ is assumed.

Figure 2:
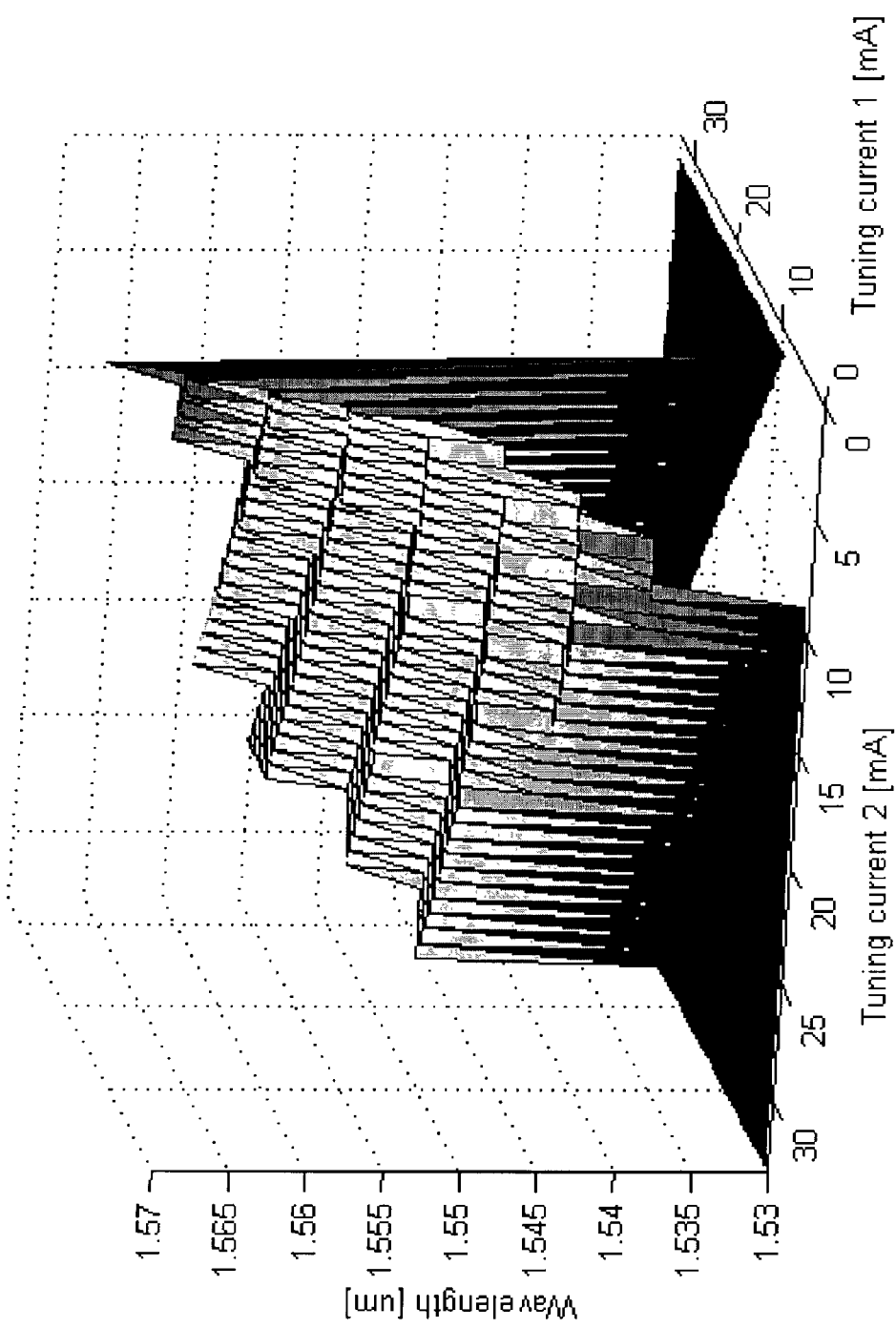
FIG. 2 is a graph showing a 3-Dimensional view of a part of the tuning characteristics.
Figure 3:
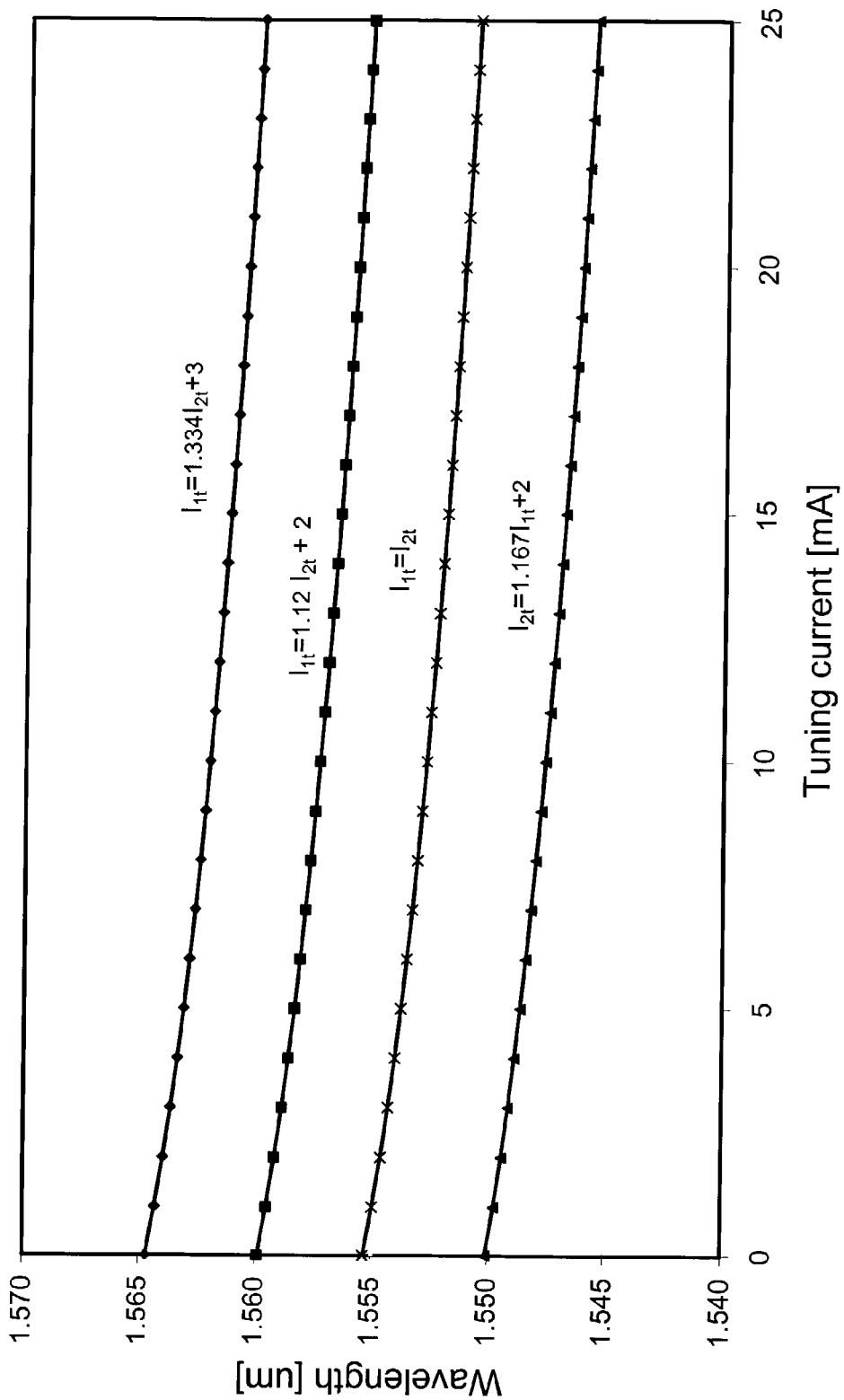
FIG. 3 is a graph of tuning current versus wavelength showing tuning characteristics along different (straight) lines in the ($I_{1t}$, $I_{2t}$)-plane, wherein tuning current stands for $I_{1t}$ or $I_{2t}$ depending on whether $I_{2t}$ is given as a function of $I_{1t}$ or vice versa.
Figure 4:
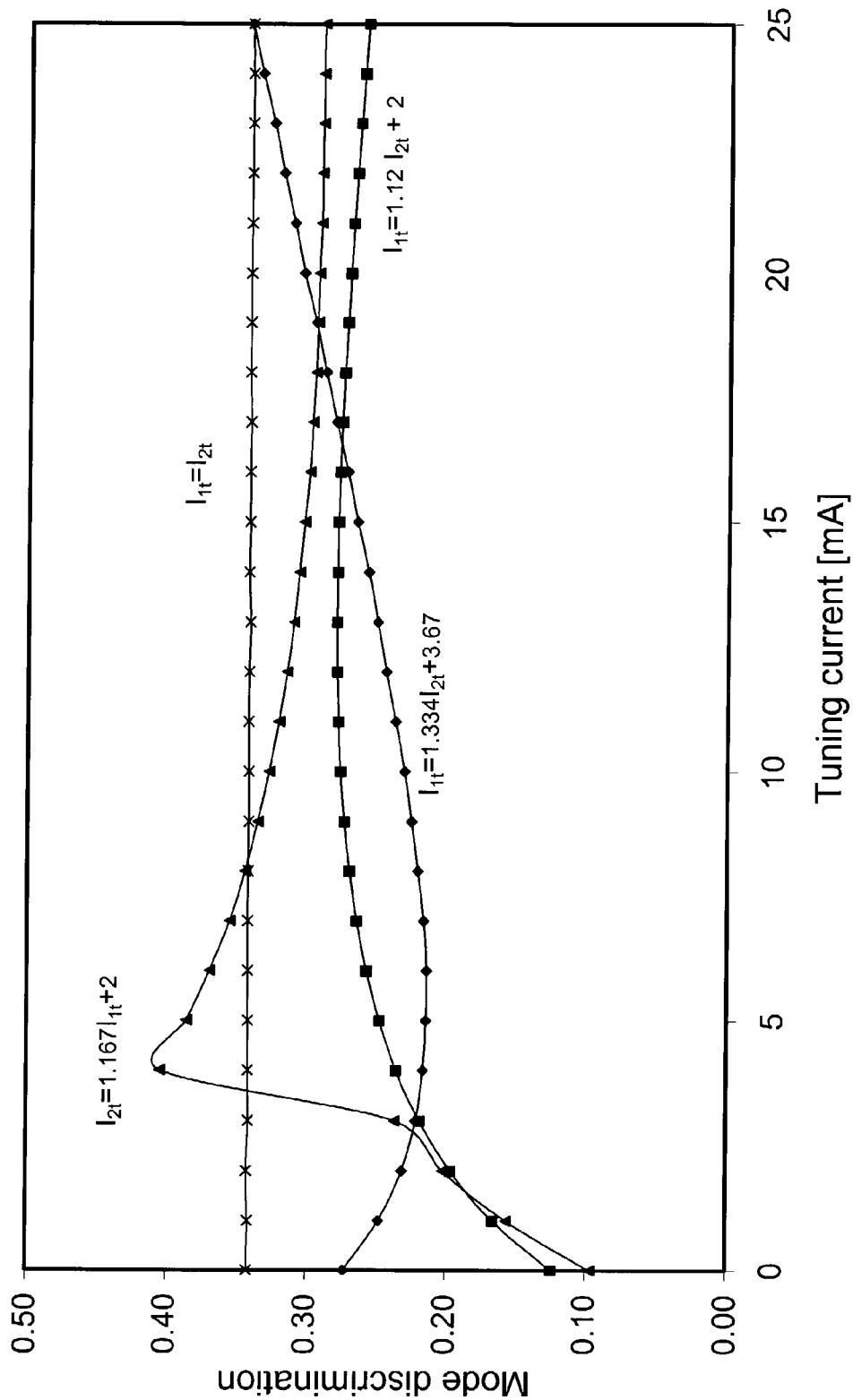
FIG. 4 is a graph showing mode discrimination ($\Delta g_{th}L$) along the tuning curves of FIG. 3.

FIG. 2 shows a part of the tuning characteristics of this laser. As in (S)SG-DBR lasers, there are number of plateaus. However, unlike in (S)SG-DBR lasers, there is a continuous wavelength change along these plateaus, i.e., the plateaus correspond with a single cavity mode. To illustrate this better, the wavelength and modal discrimination ($\Delta g_{th}L$) along a number of straight lines corresponding with the different plateaus of FIG. 2 are calculated. The variation of the wavelengths is shown in FIG. 3 and the variation of the mode discrimination in FIG. 4. From FIG. 3, it is apparent that complete coverage over several tens of nm can be achieved. In principle, as in (S)SG-DBR lasers, a total tuning range of over 50 nm should be possible. From FIG. 4, one can see that the mode discrimination (the difference in threshold gain between main and side mode) is always 0.1 or more and in most cases over 0.2. This is sufficient to guarantee a side mode rejection of over 40 dB at moderate power levels of a few mW. However, with a bigger difference between the two superperiods, a much higher mode discrimination can easily be obtained. With the used parameters, the main side mode is not an adjacent cavity mode but a mode emitting at the wavelength where two other reflection peaks partly overlap. This partial overlap can be reduced with larger differences between $L_{g1}$ and $L_{g2}$. If an adjacent cavity mode becomes the main side mode, one obtains the very large mode discrimination values of $\lambda/4$-shifted DFB lasers.

The device proposed here can be much shorter than the conventional widely tunable lasers and allows for producing higher output levels and to direct modulation up to higher frequencies. The device has a tuning section above the active section, in a direction perpendicular to the lasing direction. The tuning section can have a plurality of subsections and the subsections can have a similar structure or even have a quite different structure. The subsections are selected such that together a wide tunability of the laser is obtained although the subsections themselves are only slightly tunable.

As discussed above, in a preferred embodiment of the invention, a widely tunable laser diode with only 2 tuning currents is proposed. Moreover, the structure has no passive sections and is rather a type of tunable DFB laser. The DFB character of the laser ensures that the relative position of the cavity mode is fixed with respect to the peak of the grating reflectivity and thus allows continuous tuning and a stable single mode behavior using a single tuning current.

Preferred embodiments of the present invention have been described herein. It is to be understood, of course, that changes and modifications may be made in the embodiments without departing from the true scope of the present invention, as defined by the appended claims. The claims should not be read as limited to the described order of elements unless stated to that effect. In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention.

What is claimed is:

1. An integrated/semiconductor tunable optical laser comprising:
    an active waveguide structure for generating an emission;
    a passive tuning waveguide structure for guiding and tuning at least a portion of the emission generated by said active waveguide structure,
    wherein said active waveguide structure and said passive tuning waveguide structure are arranged to be perpendicular to a lasing direction of the laser, and
    wherein said passive tuning waveguide structure comprises at least two subsections each having a grating that are arranged along a single line that is parallel to the lasing direction of the laser; and
    at least two electrodes for applying a tuning current to each of said at least two subsections, wherein the passive tuning waveguide structure is located between said active waveguide structure and said at least two electrodes, and wherein the laser, in operation, is tuned using a respective single tuning current for each grating applied to said at least two electrodes, the respective tuning currents tuning the laser as a result of varying an effective refractive index of said passive tuning waveguide structure.

2. The laser as recited in claim 1, wherein said gratings are sampled gratings (SG) or super-structure gratings (SSG).

3. The laser recited in claim 1, wherein said subsections each include a waveguide system with reflectors having spaced reflective maxima points that provide maximum reflection of an associated wavelength,
    wherein the spacing of at least two of said reflective maxima points of the respective sections are different, and only one said reflective maxima of said sections overlaps.

4. The laser recited in claim 3, wherein at least one of said waveguide systems has a periodically broken short-period structure including short period stripped regions alternating with non-stripped regions.

5. The laser recited in claim 3, wherein at least one of said waveguide systems has a diffractive grating with a plurality of repeating unit regions, each unit region having a constant length, thus forming a modulation period, and at least one parameter that determines the optical reflectivity or transmission of said diffractive grating, the one parameter varying depending on its position in each of said repeating unit regions along a direction of optical transmission in said laser, said diffractive grating extending by at least two modulation periods.

6. The laser recited in claim 2, wherein there is a phase shift between said gratings.

7. The laser recited in claim 6, wherein said phase shift is a $\pi$ phase shift.

8. The laser recited in claim 1, further comprising AR-coatings on one or more facets of said laser.

9. The laser recited in claim 1, further comprising a sequence of semiconducting layers grown one upon another along a single line that is perpendicular to the lasing direction,
    wherein said active waveguide structure and said passive tuning waveguide structure are at least a portion of said sequence of semiconducting layers.

10. The laser recited in claim 1, wherein said active waveguide structure and said passive tuning waveguide structure are arranged such that the laser operates monomodally as a result of injecting the respective tuning currents into the at least two subsections of the passive tuning waveguide structure.

11. The laser recited in claim 1, wherein the laser has a tuning range of at least a few tens of nanometers, and
    wherein the tuning range is continuous.

12. The laser recited in claim 1, wherein the laser does not include a functioning phase section.

13. A High-Density Wavelength Division Multiplexing (HD-WDM) communication system comprising the integrated/semiconductor tunable optical laser claimed in claim 1.

14. A transmitter comprising the integrated/semiconductor tunable optical laser claimed in claim 1.

* * * * *